United States Patent
Geske et al.

(10) Patent No.: US 8,654,811 B2
(45) Date of Patent: Feb. 18, 2014

(54) SERIALLY INTERCONNECTED VERTICAL-CAVITY SURFACE EMITTING LASER ARRAYS

(75) Inventors: Jonathan C. Geske, Ventura, CA (US); Chad Shin-deh Wang, Santa Barbara, CA (US); Michael MacDougal, Camarillo, CA (US)

(73) Assignee: Flir Systems, Inc., Wilsonville, OR (US)

( * ) Notice: Subject to any disclaimer, the term of this patent is extended or adjusted under 35 U.S.C. 154(b) by 424 days.

(21) Appl. No.: 12/868,591

(22) Filed: Aug. 25, 2010

(65) Prior Publication Data

US 2012/0051384 A1    Mar. 1, 2012

(51) Int. Cl.
*H01S 5/00* (2006.01)

(52) U.S. Cl.
USPC ............. 372/50.124; 372/43.01; 372/50.1; 372/50.12; 372/50.121; 372/50.122

(58) Field of Classification Search
USPC ............. 372/50.12–50.124, 50.1, 43.01
See application file for complete search history.

(56) References Cited

U.S. PATENT DOCUMENTS

| | | | |
|---|---|---|---|
| 8,102,890 B2 * | 1/2012 | Masui et al. | 372/45.01 |
| 2006/0109883 A1 * | 5/2006 | Lewis et al. | 372/50.12 |
| 2007/0217471 A1 * | 9/2007 | DeFranza et al. | 372/50.12 |

* cited by examiner

*Primary Examiner* — Jessica Stultz
*Assistant Examiner* — Delma R Forde
(74) *Attorney, Agent, or Firm* — Haynes and Boone, LLP (57) ABSTRACT

Vertical Cavity Surface Emitting Laser (VCSEL) arrays with vias for electrical connection are disclosed. A Vertical Cavity Surface Emitting Laser (VCSEL) array in accordance with one or more embodiments of the present invention comprises a plurality of first mirrors, a plurality of second mirrors, a plurality of active regions, coupled between the plurality of first mirrors and the plurality of second mirrors, and a heatsink, thermally and mechanically coupled to the second mirror opposite the plurality of active regions, wherein an electrical path to at least one of the plurality of second mirrors is made through a via formed through a depth of the plurality of second mirrors, and a plurality of VCSELs in the VCSEL array are connected in series.

8 Claims, 10 Drawing Sheets

SERIALLY INTERCONNECTED VERTICAL-CAVITY SURFACE EMITTING LASER ARRAYS

BACKGROUND OF THE INVENTION

1. Field of the Invention

This invention relates generally to materials integration, hybridization, thermal management, and processing techniques of high-power vertical-cavity surface emitting laser arrays.

2. Description of the Related Art

Figure 1:
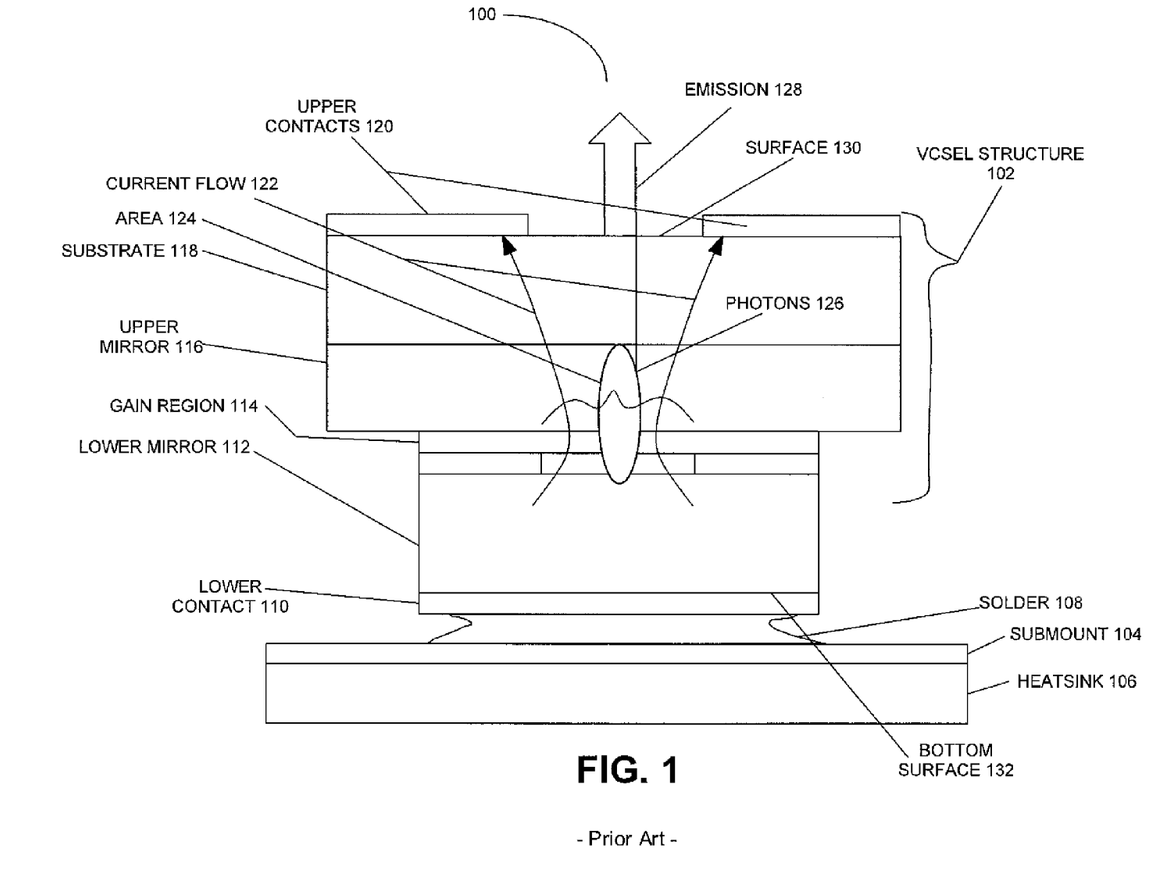
FIG. 1 illustrates a vertical-cavity surface emitting laser structure of the related art.

FIG. 1 illustrates a vertical-cavity surface emitting laser (VCSEL) structure of the related art.

FIG. 1 shows VCSEL 100, with a VCSEL structure 102 on top of a submount 104, which is typically coupled to a heatsink 106. VCSEL structure 102 is typically coupled to submount 104 via solder 108.

Lower contact 110 is coupled to solder 108, which provides an electrical contact to VCSEL structure 102. Lower mirror 112 is coupled to lower contact 110, and gain region 114 is coupled between lower mirror 112 and upper mirror 116. Upper mirror 116 is coupled to substrate 118, which has upper contacts 120 opposite upper mirror 116.

In operation, a voltage differential is placed between lower contact 110 and upper contacts 120 to create current flow 122 through gain region 114. Gain region 114 may have constraints or other current restrictions in certain parts of gain region 114 to force current flow 122 into a specific area 124 of gain region 114, which increases the current density in area 124. As current flow 122 increases, photons are generated in gain region 114, and the photons 126 begin traversing the region between upper mirror 116 and lower mirror 112, until photons 126 have generated enough other photons 126 in gain region 114 to overcome loss and create laser emission 128 from the surface of VCSEL structure 102. As such, VCSEL 100 has a lasing optical cavity, i.e., the area 124 between upper mirror 116 and lower mirror 112, that resonates in a direction perpendicular to the plane of the semiconductor surface 130, which is made possible through the gain section 114 being interposed between two high-reflectivity distributed Bragg reflector (DBR) mirrors 112 and 116. Although shown on the top surface 130 in FIG. 1, emission 128 can occur through bottom surface 132 if desired with proper allowances made in the processing.

Mirrors 116 and 112 are made from various materials, typically AlGaAs/GaAs or SiO2/TiO2 stacks, sometimes with a gold or metallic coating on the side opposite emission 128, and gain region 114 is typically GaAs or a ternary or quaternary of GaAs, e.g., GaAlAs, InGaAs, AlInGaAs etc. Other materials can be used for VCSEL 100 as desired.

VCSELs 100 are advantageous over edge-emitters in several respects. First, the output emission 128 can be circularly or arbitrarily shaped, which simplifies external coupling optics and increases coupling efficiency into fibers. Second, VCSELs 100 can easily be fabricated into 2D arrays and tested or screened on the substrate wafer before packaging. These reasons greatly reduce fabrication costs of VCSELs 100 over edge-emitting structures.

Further, edge-emitting devices require cleaving to separate the wafer into individual laser bars and facet coating to form the mirrors, while VCSELs 100 do not depend on any facets or cleaving for operation. Such design techniques greatly improve the yield and reliability of VCSELs because the output facets of edge-emitters are the main source of failure. The output aperture of a VCSEL is also larger than an edge-emitter, which results in a lower output power density at the facet and reduced hotspots on the wafer. Also, the output mirror is not fully defined by the surface 130 of the semiconductor, but rather by a stack of low and high index of refraction semiconductor layers in the mirrors 112 and 116, and hence the peak electric field is within the VCSEL structure 102 and not at the semiconductor surface 130. Thus, VCSELs do not suffer from catastrophic optical damage, commonly seen in edge-emitters. Finally, VCSELs have a lower wavelength drift coefficient (0.08 nm/° C.) than edge-emitters (0.32 nm/° C.) translating into either relaxed temperature control or better pumping efficiency when used to pump a solid-state medium with a narrow absorption range.

Currently VCSELs 100 are used primarily for lower-power applications, such as in short-reach datacom (850 and 980 nm), telecommunications (1300-1550 nm), optical mice, and spectroscopy. Higher powers are needed for optical pumping, industrial cutting, medical, and defense applications. High power laser applications have been dominated by edge-emitting devices through the use of longer cavity, broad area lasers arranged in parallel bars or serial laser bar stacking.

One of the main reasons high powers are enabled in edge-emitting devices is through proper thermal management by junction or epi-side down mounting. Although this is also true for VCSELs, VCSEL designs have not performed as well in such applications.

The main source of heating in an electrically pumped VCSEL 100 is in the active region 114 and in the DBRs 112 and 116 through joule heating where current flow 122 is passed. The heat in a VCSEL 100 must then be pulled out of the gain region 114. By flip-chip bonding the VCSEL 100 epi-side down onto a heat sink 106, significant improvement of the output power characteristics can be achieved due to a short heat extraction path.

With proper design and thermal management, high-power VCSELs have been achieved at 980 nm by bonding a 2D array of high-efficiency VCSELs designed with an optimized fill factor. The anode was bonded to the heat sink and the cathode metal was deposited directly onto the backside thinned substrate. Currently, overall wall-plug efficiencies are at 50%, slightly lower than the state-of-the-art high-power edge-emitting lasers (70%).

At the wavelengths near 900 nanometers or longer, high-power VCSELs can be easily obtained using standard VCSEL processing techniques. Flip-chip bonding allows for VCSELs to be mounted epi-side down onto heat sinks 106. The GaAs substrate 118 is transparent to the >900 nm emission, and any loss from free carrier absorption can be minimized by thinning and polishing the substrate 118. Backside metal onto upper contact 120 can be deposited using standard techniques, allowing ease of direct contacting or wirebonding to the metalized substrate 118 and the epi-side contacts via the heat sink. This process readily allows annealing of both contacts prior to flip-chip bonding the VCSEL 100 devices to a heat sink 106. This is important as annealing of the device contacts results in lower contact resistance and thus higher efficiencies and lower power dissipation, key requirements for efficient, high-power VCSELs.

However, for emission energies near or larger than the bandgap of the GaAs substrate 118, the emission from the gain region 114 would be absorbed by the substrate 118, resulting in lower output emission 128 power and increased heating due to absorption, thereby limiting the ability to easily fabricate bottom emitting VCSELs using flip-chip bonding. While top emitting VCSELs with wavelengths shorter than 900 nm can be designed, the structure 102 would have to be mounted with the substrate 118 side against the heat sink 106, thereby limiting the effective thermal transmission from gain region 114 to heatsink 106, which results in lower heat dissipation and decreased device performance because of the thermal impedance of the substrate.

Therefore, the challenge in developing high-power, bottom-emitting, VCSELs below about 900 nm lies in fabrication techniques for extracting the radiated light emission while also providing good thermal management for high efficiency.

Figure 2:
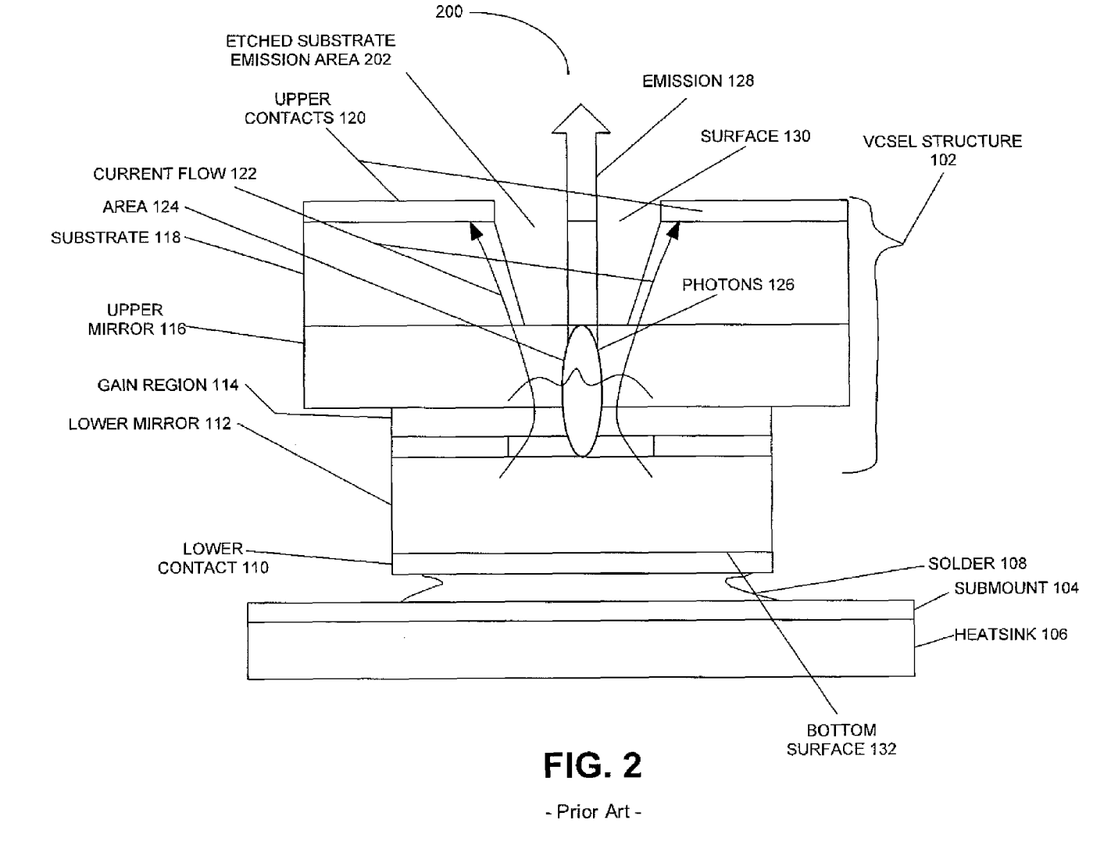
FIG. 2 illustrates an example bottom-emitting VCSEL of the related art.

FIG. 2 illustrates an example bottom-emitting VCSEL of the related art.

VCSEL 200 is shown, with an etched substrate emission area 202, also known as a substrate via 202 or light outcoupling via 202. This via 202 is made by removing the substrate 118 is areas where emission 128 is desired from VCSEL 200, however, this partial removal of the substrate 118 requires deep and precise etching of the substrate 118. While this approach facilitates backside metal deposition and annealing prior to flip-chip bonding, high packing densities for VCSEL 200 arrays is difficult due to the relatively large diameter and deep vias 202 in the substrate 118 to account for diffraction of the emission 128.

Other approaches to this issue have employed transparent substrates 118. One approach is to grow the VCSEL structure 102 on AlGaAs substrates 118, which are transparent at wavelengths above the bandgap energy of GaAs [4]. This approach, however, is limited to AlGaAs substrates 118 containing low concentrations of aluminum. This approach requires challenging and precise oxide removal techniques of the AlGaAs substrate before commencing growth, resulting in possible degradation of the epilayers grown. Furthermore, this approach limits the VCSEL design to those wavelengths that are smaller than the bandgap of the AlGaAs substrate.

Within VCSEL structures, high power inputs are needed to produce high power outputs. Typically, a 1 kilowatt output is generated using 2 volts and 1 kiloamperes, but this is difficult in VCSEL structures because it is difficult to generate such high currents and also because of the heat generated within the structure. Prior attempts at running high current in series VCSEL devices has been somewhat frustrated because of the planar connections in VCSELs. Changes in the voltage to generate equivalent power is possible if the strength of the dielectric is high enough, but parallel current generation for each VCSEL as done in the related art reduces or eliminates the advantage of increasing the voltage, as VCSELs again are difficult to connect in a series fashion.

Other techniques for transparent substrates involve wafer bonding of the 850 nm VCSEL epitaxial structure onto a GaP substrate, temporary carrier transfers to glass substrates, and complete removal of the GaAs substrate. Each of these techniques reduce yields and result in less than desirable devices.

It can be seen, then, that there is a need in the art for high power VCSEL devices and arrays that can be connected serially.

SUMMARY OF THE INVENTION

To minimize the limitations in the prior art, and to minimize other limitations that will become apparent upon reading and understanding the present specification, the present invention describes Vertical Cavity Surface Emitting Laser (VCSEL) arrays and methods for making such arrays.

A Vertical Cavity Surface Emitting Laser (VCSEL) array in accordance with one or more embodiments of the present invention comprises a plurality of first mirrors, a plurality of second mirrors, a plurality of active regions, coupled between the plurality of first mirrors and the plurality of second mirrors, and a heatsink, thermally and mechanically coupled to the second mirror opposite the plurality of active regions, wherein an electrical path to at least one of the plurality of second mirrors is made through a via formed through a depth of the plurality of second mirrors, and a plurality of VCSELs in the VCSEL array are connected in series.

Such a VCSEL array further optionally comprises the electrical path to a mirror in the plurality of second mirrors and an electrical path to a first mirror in the plurality of first mirrors being accessed from a non-emission surface of the VCSEL, a plurality of VCSELs in the array being connected in parallel, a plurality of electrical paths to the plurality of first mirrors, the plurality of electrical contacts being annealed, the plurality of electrical paths being made from copper, the plurality of electrical paths being at least partially formed through chemical mechanical planarization, and a plurality of VCSEL arrays being formed on a single substrate.

A further understanding of the nature and details of the present invention may be realized by reference to the remaining portions of the specifications and drawings. The preferred embodiments of this invention are described below to further clarify the structure and method for achieving said invention.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

One of the main reasons high powers are enabled in edge-emitting devices is through proper thermal management by junction or epi-side down mounting. This is also true for VCSELs. The main source of heating in an electrically pumped VCSEL pixel is in the active region and in the DBRs through joule heating where current is passed. The waste heat in a VCSEL gain producing active region must then be pulled out from the top of the pillar and also laterally from the sidewalls of the pillar. By flip-chip bonding the VCSEL epi-side down onto a heat sink, significant improvement of the output power characteristics can be achieved. At very high currents, appreciable and undesirable joule losses can occur in the electrical planar contacts to the parallel interconnected pixels in the VCSEL array. This parasitic loss scales with the square of the current and can be very detrimental to the operation of high power VCSEL arrays if not controlled.

Thus, in order to develop very high-power VCSEL arrays emitting at wavelengths below the substrate absorption bandgap of GaAs (typically below about 900 nm), the present invention discloses an advanced structure design along with advanced process techniques and approaches to allow VCSEL arrays to be connected in series.

The following conditions typically apply to achieve high-output power VCSEL arrays: 1) the VCSEL array is typically mounted epi-side down to the heat sink; 2) the GaAs substrate is typically removed; 3) both contacts are typically annealed prior to flip-chip mounting; and 4) anode and cathode current bus layers typically do not compete for space on the chip carrier. The reasons for these conditions are respectively: 1) epi-side down mounting is typically the most effective way to thermally manage the power dissipation from the VCSEL array chip; 2) removing the GaAs substrate minimizes the absorption resulting from bottom or substrate-emitting VCSELs to enhance overall output power and minimize power dissipation; 3) contacts must be annealed to minimize contact resistance and enhance power efficiency, however, annealing cannot be performed after flip-chip bonding without compromising the solder bonds; and 4) placing anode and cathode bus layers on differing planes allows for denser VCSEL packing arrays which is desirable for high-output power VCSEL arrays. However, prior attempts at connecting these devices in series have not produced dense structures or been thermally efficient. The present invention allows for serial connection of epi-side metal to substrate-side metal layers through vias, which allows for better thermal management and serial connection of planar VCSEL structures.

Figure 3:
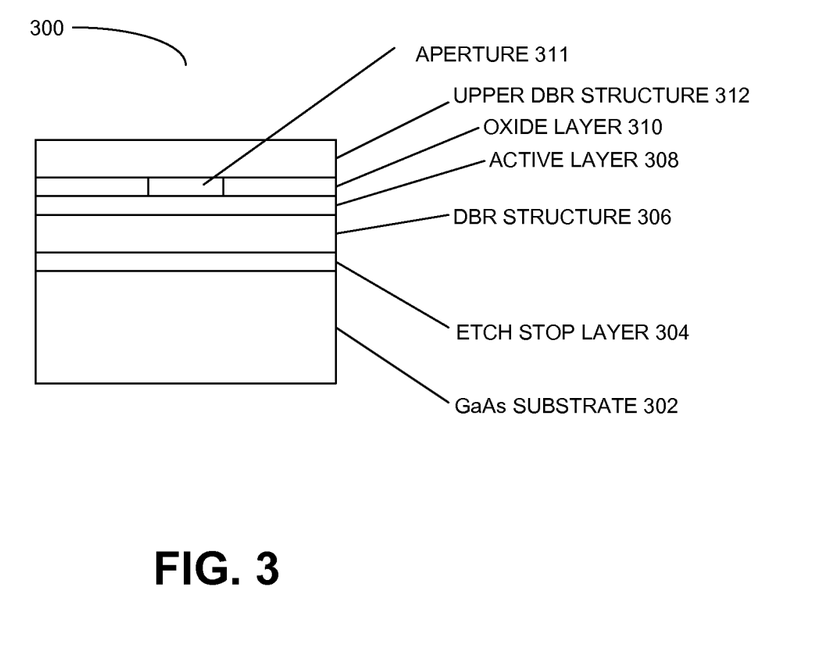
FIG. 3 illustrates a VCSEL structure as used in one or more embodiments of the present invention.

FIG. 3 illustrates a VCSEL structure as used in one or more embodiments of the present invention.

VCSEL 300 illustrates substrate 302, which is typically a GaAs substrate 302, with an etch stop layer 304 and DBR structure 306. Coupled to DBR structure is active layer 308, which is typically InAlGaAs and an oxide layer 310 which includes an aperture 311 in the oxide 310 is typically used as a current confinement layer to force current through a small area of active layer 308. Upper DBR structure 312 completes the VCSEL structure 300, which will have electrical contacts applied at a later stage of processing.

VCSEL 300 is typically produced on a substrate 302 in arrays, and FIGS. 4-10 illustrate side views of an array of VCSELs in accordance with one or more embodiments of the present invention.

Figure 4:
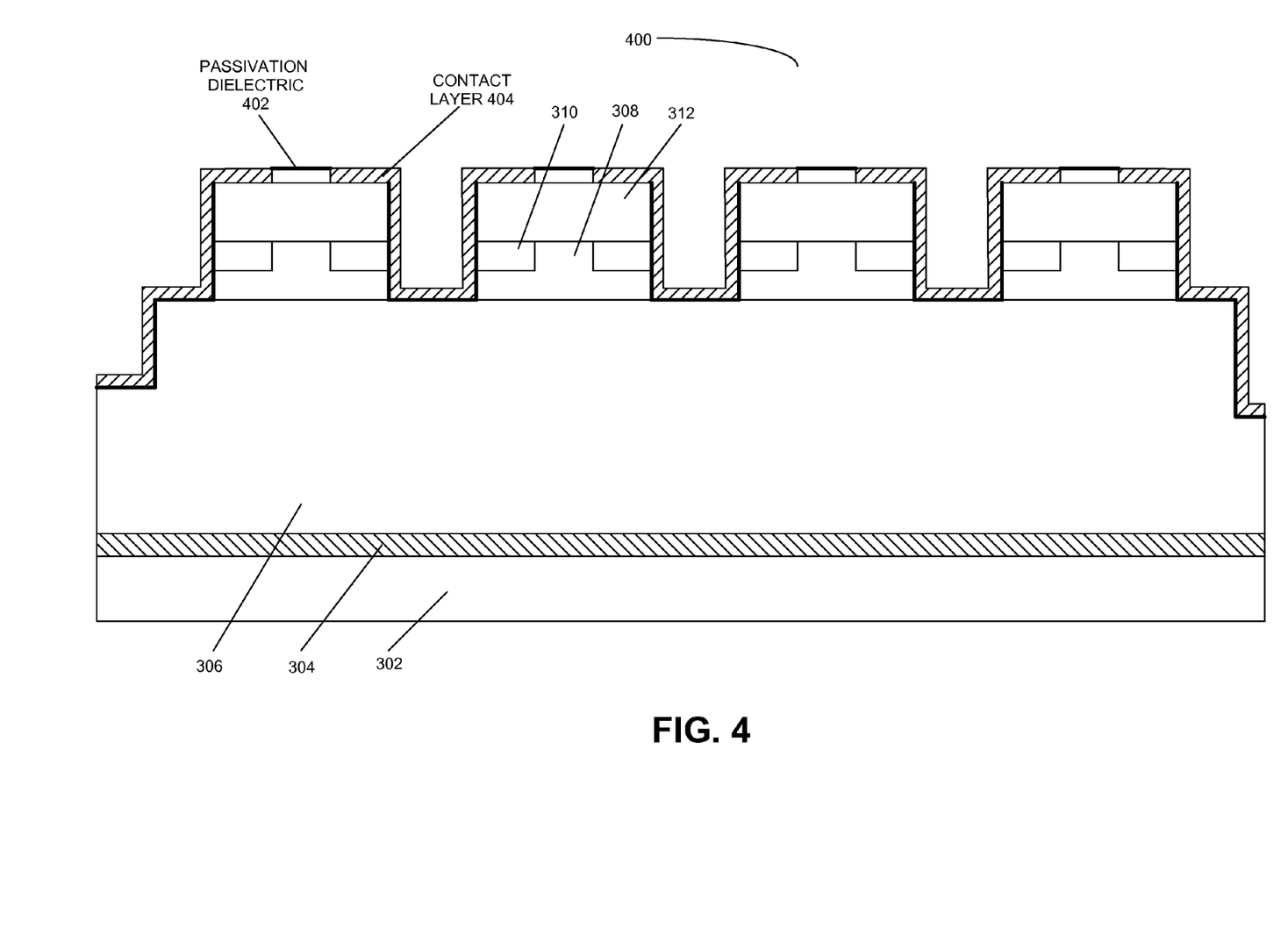
FIGS. 4-10 illustrate process step side views of an array of VCSELs in accordance with one or more embodiments of the present invention.

Array 400 is shown, with processing of VCSEL 300 structures into a plurality of VCSEL structures. Substrate 302 and etch stop layer 304 are still shown, and DBR structure 306 is etched and otherwise processed, along with active layer 308, oxide layer 310, and upper DBR structure 312, to create an array 400 of VCSEL structures.

Onto these structures a passivation dielectric 402 is placed on upper DBR structure 312 for emission from the VCSEL, and a contact layer 404, typically gold, is also placed on the structures in array 400.

The present invention provides an array of serially connected VCSELs in array 400, which are connected through vias that allow for serial connections. Serial connections between VCSELs, whether in an array 400 or not, allow for lower current draws and lower joule heating issues, and allows for similar output power with manageable input current requirements.

For example, a 1 kilowatt VCSEL device with a slope efficiency of 1 Watt/Amp using the present invention can now use a single 20 volt, 100 Ampere power supply, which could provide power to all of the VCSELs in array 400 since sections of parallel connected VCSEL pixel arrays can be connected serially across the power supply rather than in parallel. Fully parallel connections for the VCSEL array chip would require higher available current from the power supply because each leg of the parallel connection would require 1 kiloamperes at 2 volts, and thus the total power supply current draw would be 1 kiloamperes for such a 1 Kilo-watt VCSEL pixel array chip.

Further, lower currents are more manageable because they create less joule heating within the VCSEL structure, making the structure more efficient by reducing the operating input power and waste heat generation.

The present invention demonstrates array 400 that allows for emission from VCSEL structures in array 400 at an 750-900 nm wavelength (in the bandgap of GaAs). The present invention also discloses annealed contacts and current bus layers on the epi-side and on the substrate-side of the array 400. The present invention provides a design apparatus to enable 2D VCSEL arrays to be flip-chip bonded onto heat sinks after contact metal annealing, thereby enabling dense, high-power, high-efficiency VCSEL arrays. Although discussed with respect to a wavelength range for target VCSELs with 750-900 nm emission, the present invention is not limited to 750-900 nm emissions; the process of the present invention extends to other wavelengths and VCSEL materials including wavelengths from 300 nm to 3 microns. The present invention describes the VCSEL structure and the process techniques used to create the structures of the present invention.

Heat Removal and Contact Plating

Figure 5:
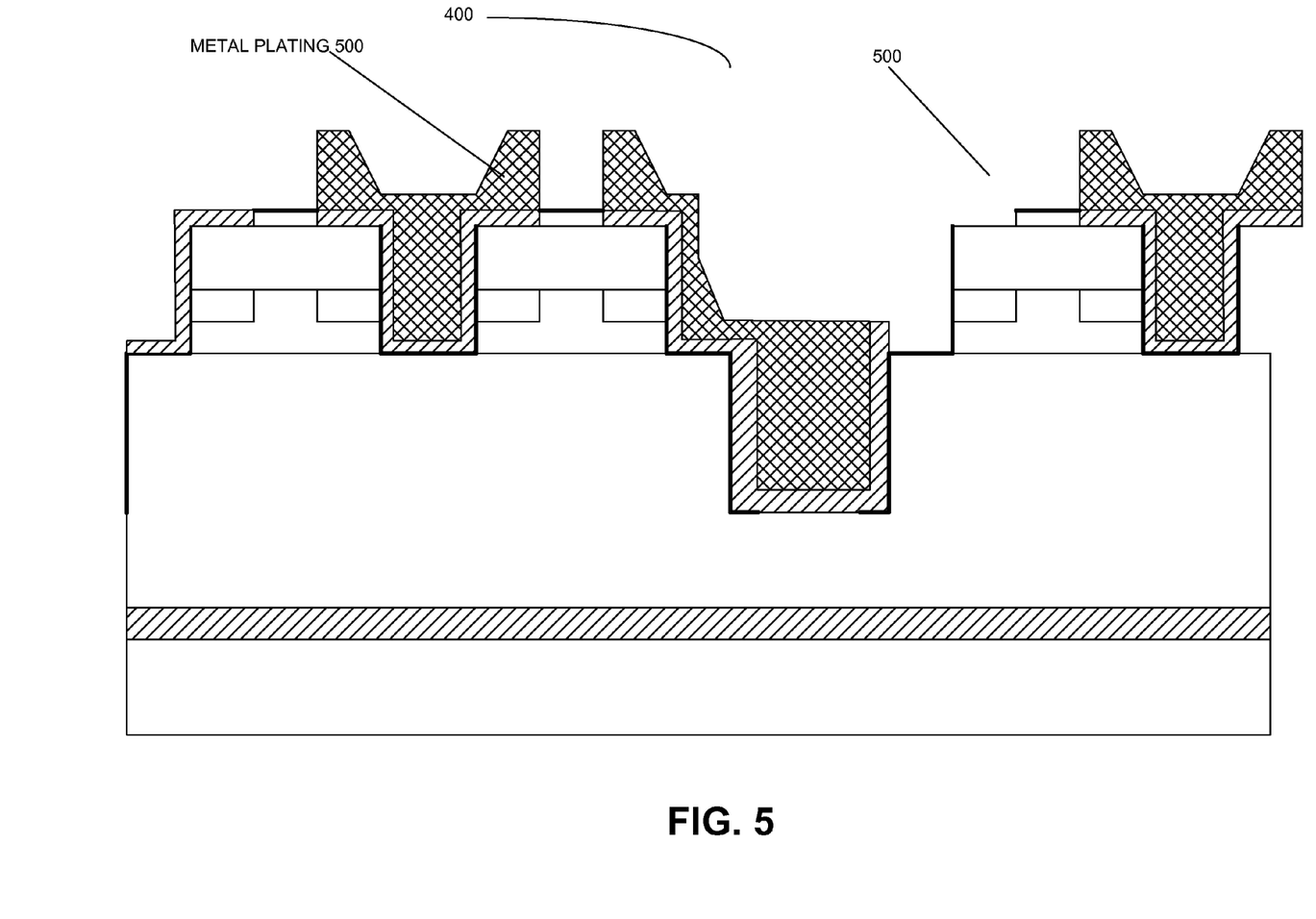
Figure 6:
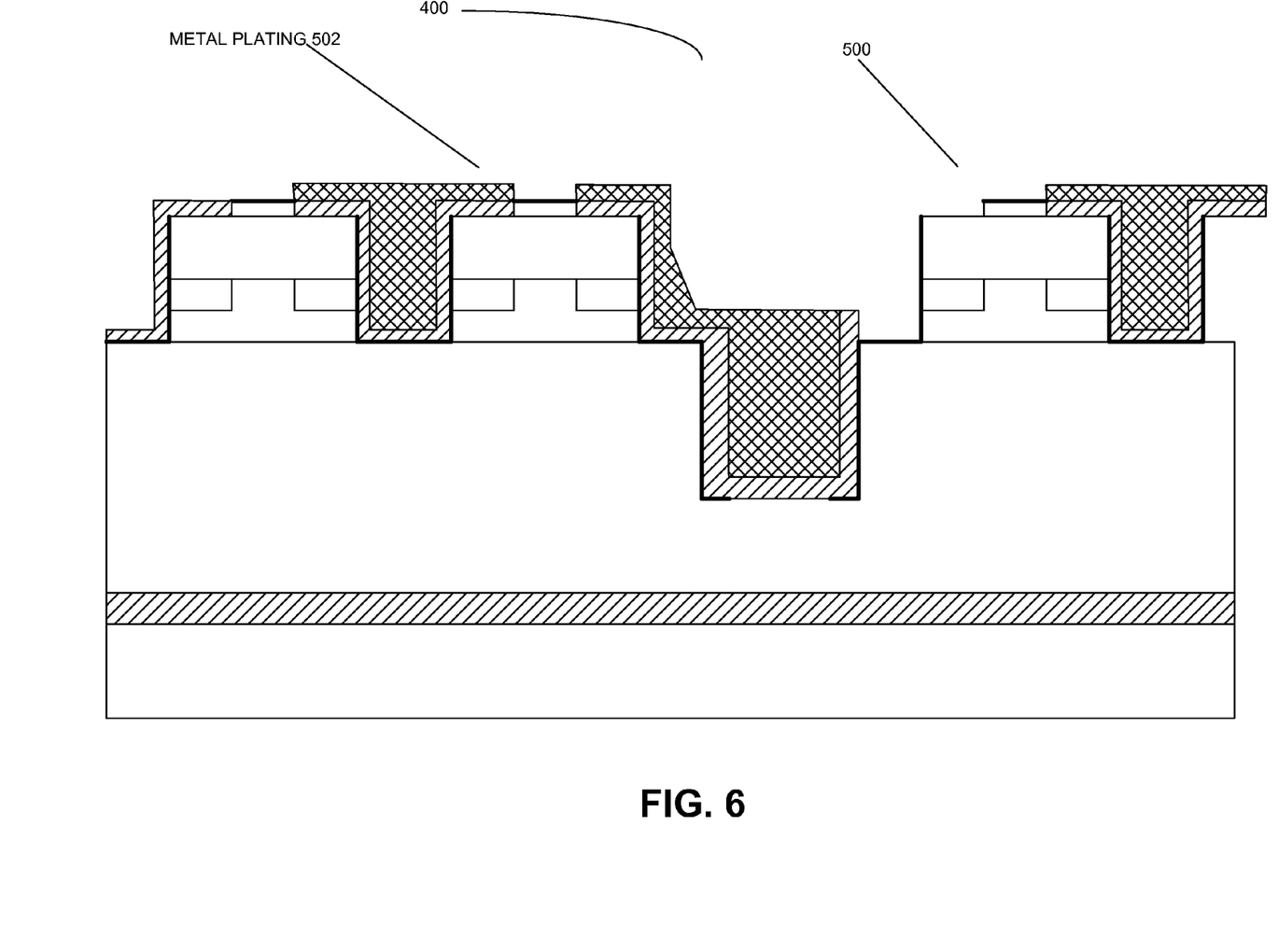

FIGS. 5 and 6 illustrate metal plating and chemical mechanical planarization processes in accordance with one or more embodiments of the present invention.

Array 400 is shown, with plating layer 500 covering the contact layer 404 previously applied to array 400. FIG. 6 illustrates plating layer 500 being altered in shape to contact layer 502, which is typically performed by a polishing or chemical mechanical planarization (CMP) process. Plating layers 500/502 are typically copper, but can be other metals or other electrically conductive materials without departing from the scope of the present invention.

Figure 7:
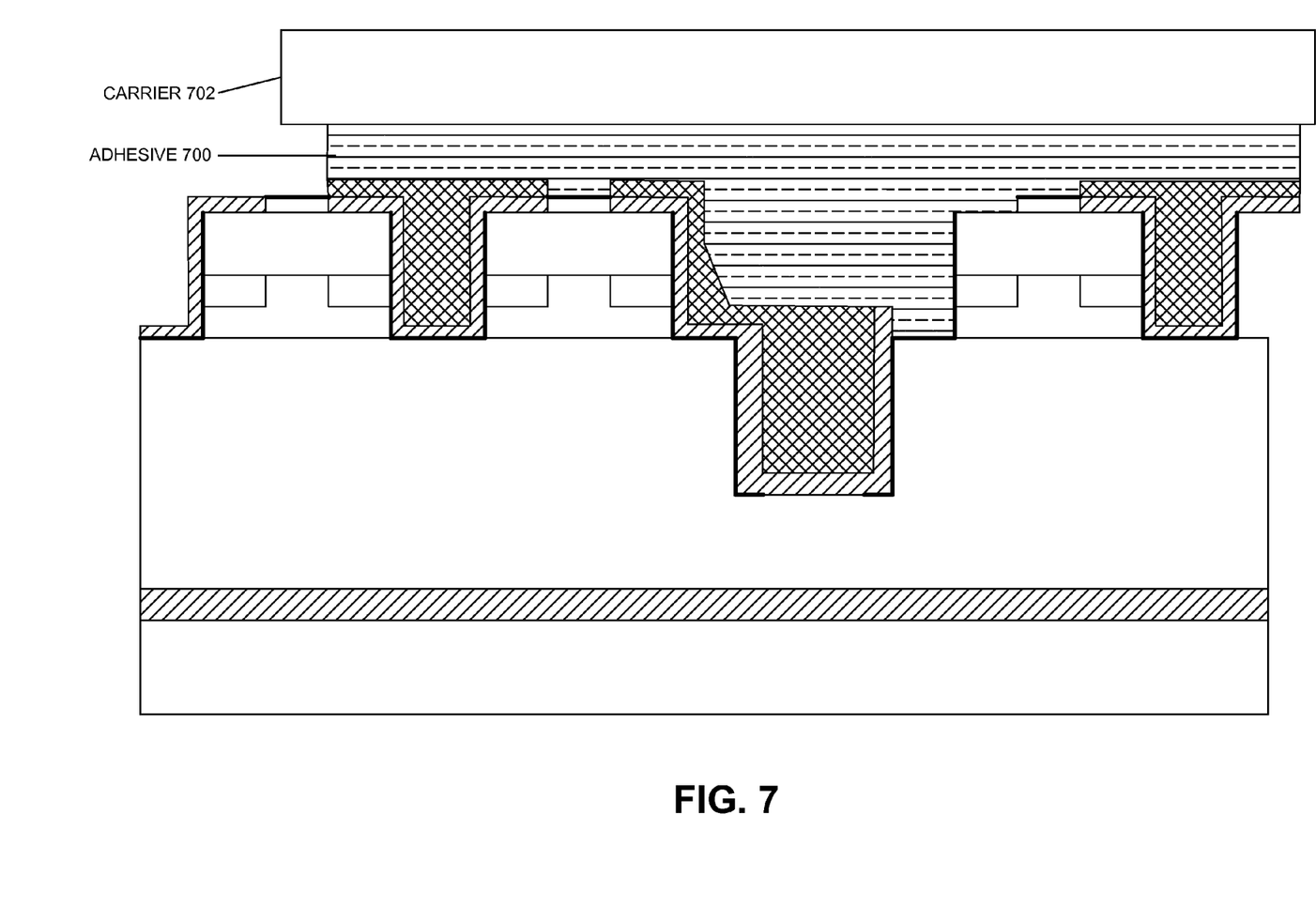

FIG. 7 illustrates an embodiment of a carrier wafer bonded to the array of the present invention.

Array 400 is shown, with adhesive 700, typically a polymer adhesive, coupled between array 400 and carrier wafer 702. Carrier wafer 702 is used as a mechanical support during processing of the backside of the array 400.

Figure 8:
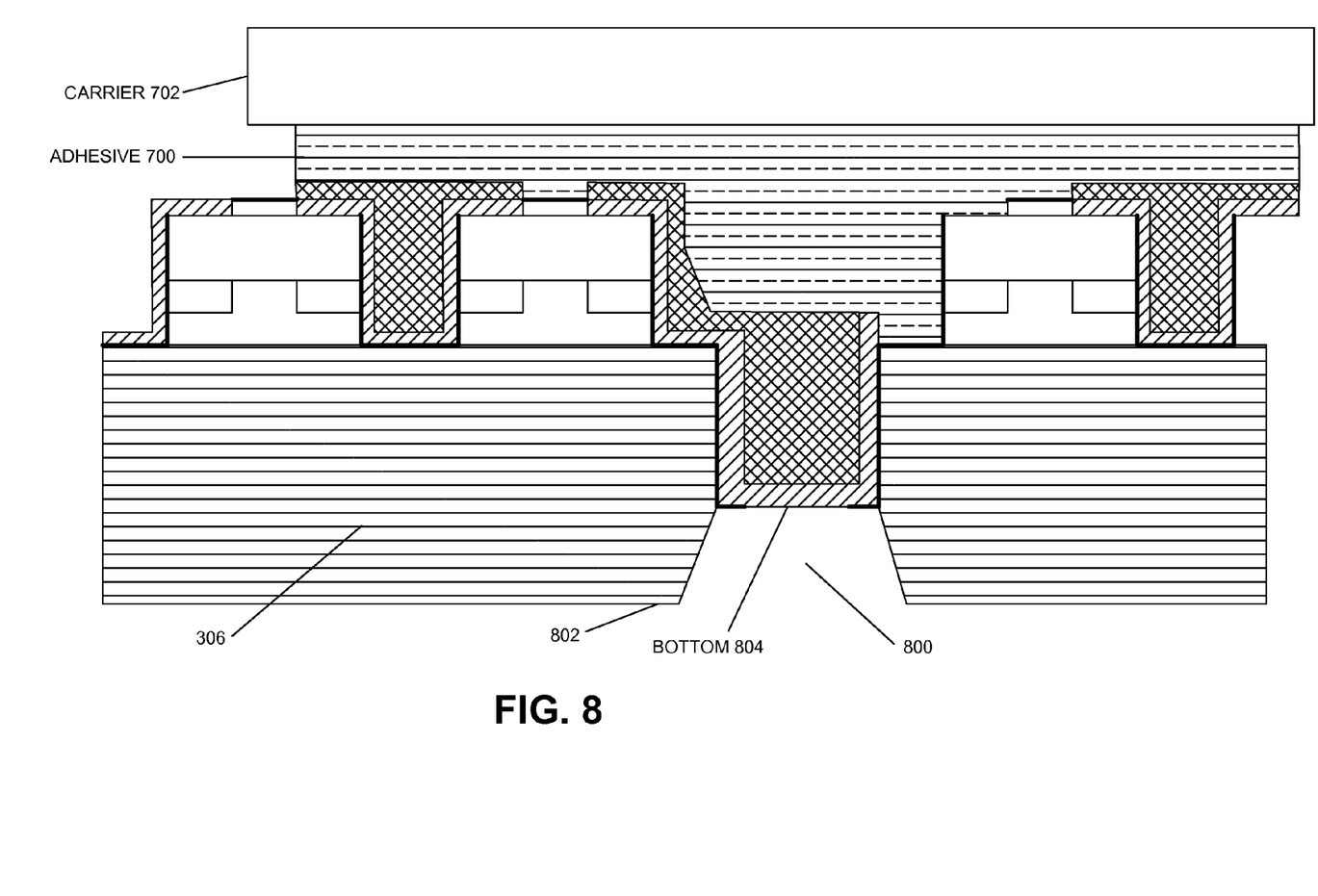

FIG. 8 illustrates additional processing of the array of the present invention.

Substrate 302 and etch stop layer 304 are removed in FIG. 8, and via 800 is etched into the bottom 804 of DBR structure 306. Since the structures in array 400 are now mechanically held together via carrier 702 and adhesive 700, the entire substrate 302 can be removed and processing can be performed on surface 802.

The substrate 302 is typically removed through one or more processes, typically mechanical lapping and/or wet selective etching of the substrate, whereby the wet selective etching stops on a sacrificial epilayer 304 which is subsequently removed. Anti-reflection or other optical coatings can be deposited on the substrate side as well if such coatings are desired.

Conventional IR lithography should ensure proper alignment of via 800 on surface 802, and conventional dry or wet etch chemistries will stop the etch on surface 802. After etching the via 800, additional metal is then deposited to bridge and connect metal from the laser epi-side second contact to the substrate-side current bus layer metal as described with respect to FIG. 9.

Figure 9:
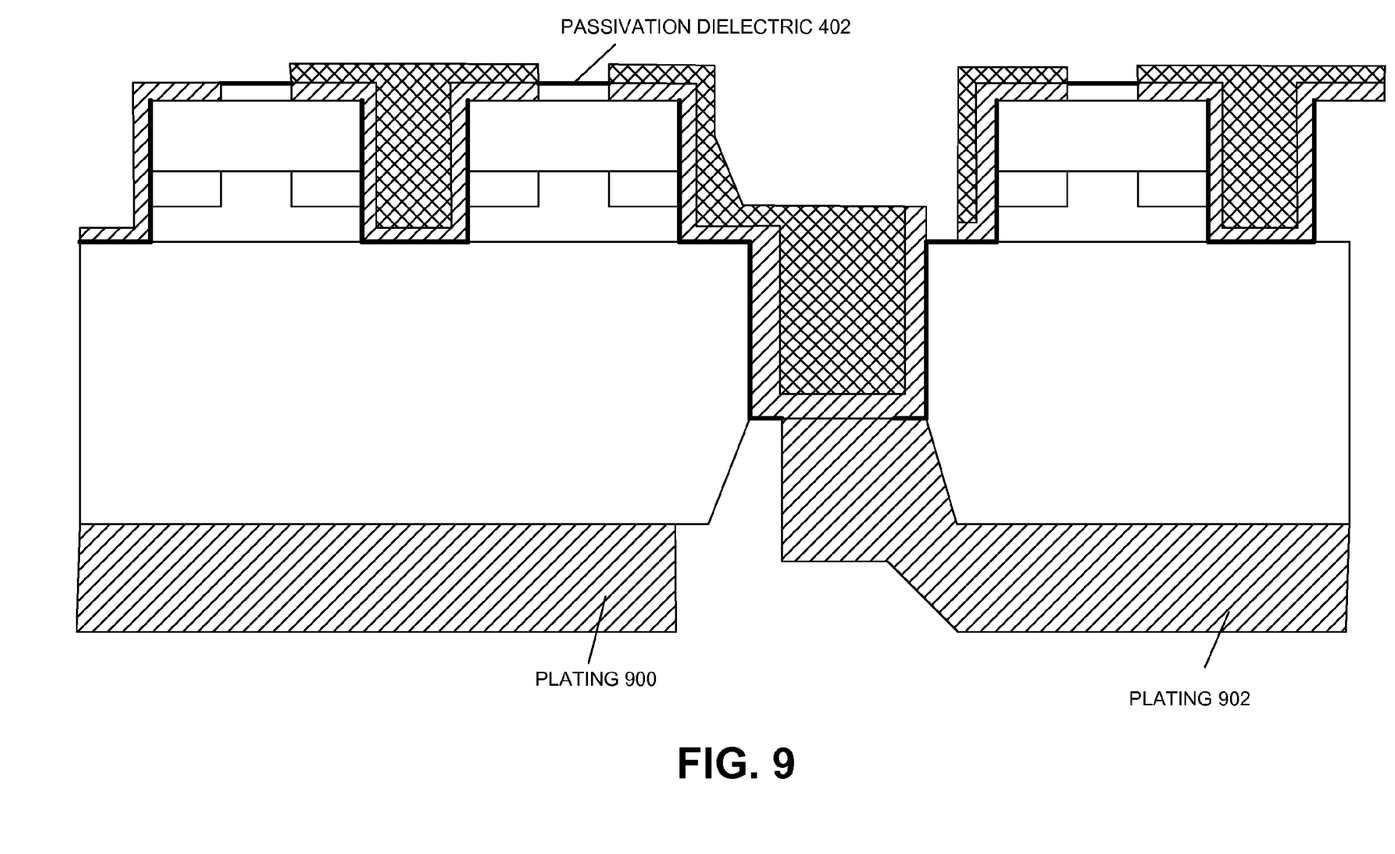

FIG. 9 illustrates metallization and thermal mounting of the VCSEL of the present invention.

Array 400 is again shown, now with plating 900 and plating 902 shown.

To realize 8xx nm dense 2D VCSEL arrays, it is imperative to remove the heat by flip-chip bonding on the epi-side (surface 802) of the devices to a heat sink. It is important to note that VCSELs, like other diodes, can be designed with common anode or common cathode configurations. In the other embodiment, the designation laser epi-side first and laser epi-side second contact are switched. By first placing both contacts on the epi-side of the wafer, contact annealing can be done to ensure ohmic contacts.

Now, plating 900 provides an electrical path to the anode, and plating 902 provides an electrical path to the cathode of the array 400 of VCSELs in accordance with the present invention. Further, plating 902, through via 800, now allows current flow through the metal plating 500 to the contact layer 404, which allows for the current to flow closest to the heatsink of the VCSEL array 400.

Thus, the contact to the emission side of the VCSEL array can be from the non-emission side (where platings 900 and 902 are located) or from the emission side, or from other locations as desired.

There is flexibility to the placement of layers in the generic preferred embodiment described herein. For example, the placement of the laser epi-side and first and second contacts can be varied. The contacting scheme can be a single or double intra-cavity structure, with flexibility as to which layer the intra-cavity contact is placed. This can be optimized with proper design and doping of the epilayers and processing. It is also important to note that the via 800 connecting the substrate-side current bus layer to the laser epi-side second contact must not occupy the exact same space as the laser epi-side second contact. There must be epilayers remaining contacting the laser epi-side second contact in order to pass current through the VCSEL structure. Therefore, it is recommended that that vias 800 be properly designed to ensure the proper electrical path resistance for the laser epi-side second contact as well as provide sufficient current handling capabilities to the substrate-side current bus. Both, one, or neither of the epi-side first and second contacts may be a type requiring annealing for low contact resistance.

Figure 10:
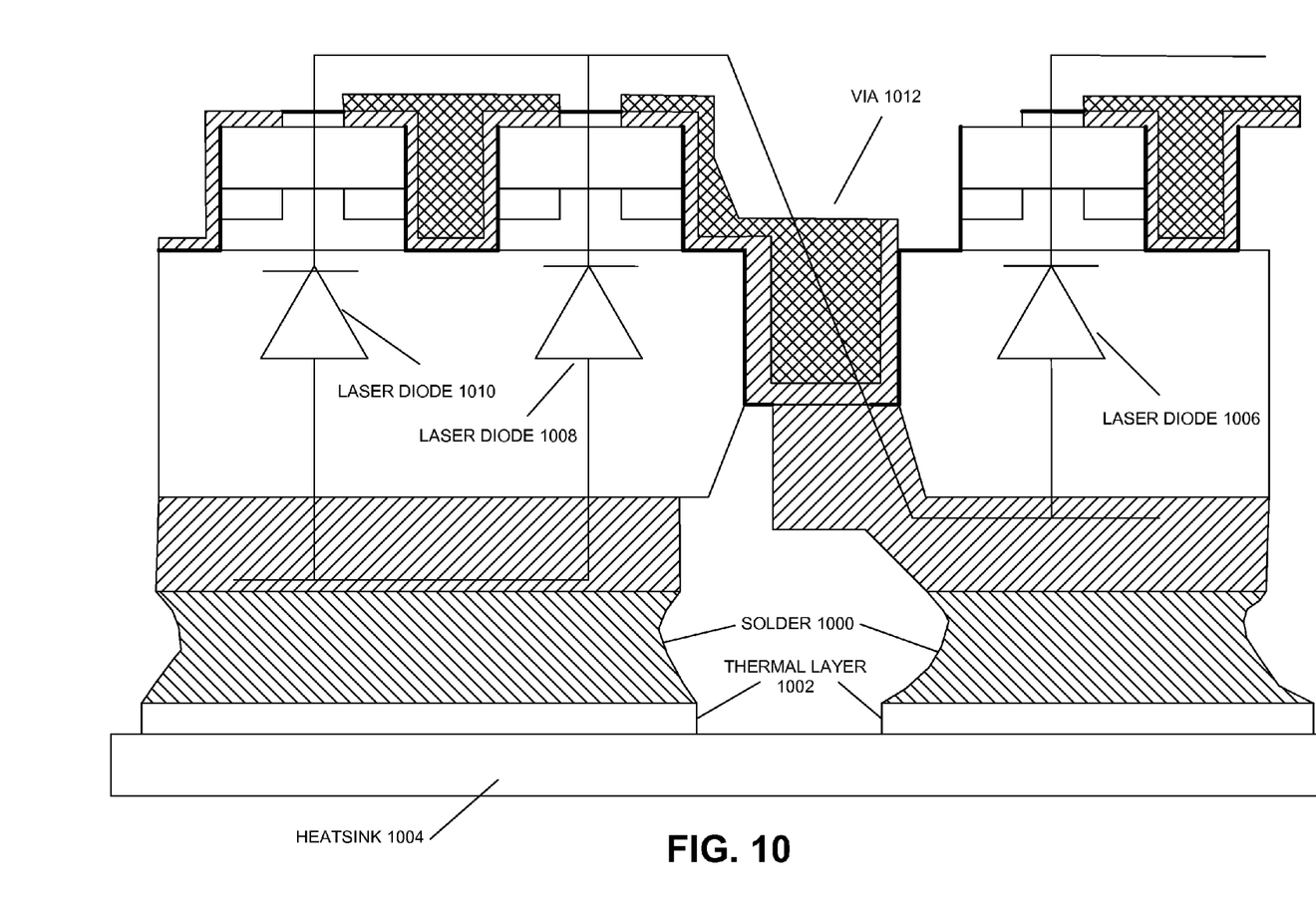

FIG. 10 illustrates a heatsink-mounted VCSEL array in accordance with one or more embodiments of the present invention.

Array 400 is again shown, with solder 1000, thermal layer 1002, and heatsink 1004 positioned as shown. Thermal layer 1002 is typically a layer of gold, but can be other thermally conductive materials as desired, or solder 1000 can be directly attached to heatsink 1004 if desired.

Array 400, as shown in FIGS. 4-10, is easily manipulated to form series and parallel electrical connections between the individual VCSEL structures shown. Through the use of vias 800, such connections for series and parallel connected VCSELs to minimize current loading on individual devices or to provide high power through combination of parallel outputs allows for applications of VCSELs where previously such designs were not considered.

For example, series connected laser diodes are of interest because of the reduction in high operating current replaced by higher input voltages required. Single large format 2D arrays operate in the tens to hundreds of amperes with one to a few volts. It is often useful in some applications to reduce this operating current but have instead higher operating voltages. The higher operating voltage is due to the series connect structure. To achieve a series connect 2D VCSEL array, 2 independent 2D VCSEL array sections can be laterally interconnected by connecting the cathode of one array section to the anode of the other array section.

Again, the present invention allows for this serial interconnection through the use of connections from one side of the substrate to the other, also called a "via" or "through connection."

FIG. 10 shows schematic equivalents of laser diodes 1006-1010, whereby one 2D VCSEL array (of laser diodes 1008-1010) is shown on one side and another 2D VCSEL array (represented by laser diode 1006) on the other. The arrays of laser diodes can be of any number, and any number of laser diodes in each group or array is possible within the scope of the present invention. The cathodes of laser diodes 1008 and 1010 are connected in series with the anode of laser diode 1006. Via 1012 allows for this serial connection, and depending on how the remainder of the laser diodes in the VCSEL array are connected with solder 1000, any serial and/or parallel arrangement of VCSELs are possible within the scope of the present invention. Further, although shown with cathodes of laser diodes 1006-1010 at the top of array 400, anodes of laser diodes can be along either side of array 400, and array 400 can be inverted or otherwise oriented, without departing from the scope of the present invention.

CONCLUSION

The invention described above can be applied to virtually any semiconductor material or group of material, using adjustments to processing recipes and masking layers for the epi and substrate-side well-known to those skilled in the art. While this invention has been particularly shown and described with references to preferred embodiments thereof, it will be understood by those skilled in the art that various changes in form and details may be made therein without departing from the spirit and scope of the invention as defined by the appended claims.

The present invention describes Vertical Cavity Surface Emitting Laser (VCSEL) arrays and methods for making such arrays.

A Vertical Cavity Surface Emitting Laser (VCSEL) array in accordance with one or more embodiments of the present invention comprises a plurality of first mirrors, a plurality of second mirrors, a plurality of active regions, coupled between the plurality of first mirrors and the plurality of second mirrors, and a heatsink, thermally and mechanically coupled to the second mirror opposite the plurality of active regions, wherein an electrical path to at least one of the plurality of second mirrors is made through a via formed through a depth of the plurality of second mirrors, and a plurality of VCSELs in the VCSEL array are connected in series.

Such a VCSEL array further optionally comprises the electrical path to a mirror in the plurality of second mirrors and an electrical path to a first mirror in the plurality of first mirrors being accessed from a non-emission surface of the VCSEL, a plurality of VCSELs in the array being connected in parallel, a plurality of electrical paths to the plurality of first mirrors, the plurality of electrical contacts being annealed, the plurality of electrical paths being made from copper, the plurality of electrical paths being at least partially formed through chemical mechanical planarization, and a plurality of VCSEL arrays being formed on a single substrate.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto and the full range of equivalents to the claims thereof.

What is claimed is:

1. A Vertical Cavity Surface Emitting Laser (VCSEL) array, comprising:
   a first array of laser diodes;
   a second array of laser diodes, wherein the first and second array of laser diodes are arranged between a first mirror layer and a second mirror layer, and
   wherein the VCSEL array is configured to transmit through the first mirror layer, each laser diode having an anode and a cathode; and
   a heatsink, thermally coupled to the second mirror layer through a first metal plate and a second metal plate, wherein the anodes for the first array of laser diodes couple in parallel to the first metal plate, and wherein the cathodes for the first array of laser diodes couple in parallel to the second metal plate through an electrical path extending through a first via formed through the second mirror layer and wherein the anodes for the second array of laser diodes couple in parallel to the second metal plate to connect the first and second array of laser diodes in series.

2. The VCSEL array of claim 1, further comprising a plurality of electrical contacts to the cathodes for the first and second array of laser diodes.

3. The VCSEL array of claim 2, wherein the plurality of electrical contacts are annealed.

4. The VCSEL array of claim 2, wherein the plurality of electrical contacts are made from copper.

5. The VCSEL array of claim 2, wherein the plurality of electrical contacts are at least partially formed through chemical mechanical planarization.

6. The VCSEL array of claim 1, further comprising a third array of laser diodes and a third metal plate, wherein the third metal plate electrically couples to the anodes for the third array of laser diodes and also couples to the cathodes for the second array of laser diodes through an electrical path extending through a second via formed through a depth of the second mirror layer to connect the second and third array of laser diodes in series.

7. A method of using the VCSEL array of claim 1, the method comprising:
   driving current through the first metal plate into the first array of laser diodes' anodes; and
   driving the current from the first array of laser diodes' cathodes through the electrical path extending through the first via and through the second metal plate into the anodes of the second array of laser diodes' anodes.

8. A method of making the VCSEL array of claim 1, the method comprising:
   forming the plurality of first mirrors and the plurality of substrate-side second mirrors as epitaxial layers on a substrate: and
   removing the substrate to expose the plurality of substrate-side second mirrors.

* * * * *